(12) United States Patent
Vieyra et al.

(10) Patent No.: US 10,178,815 B1
(45) Date of Patent: Jan. 8, 2019

(54) PROTECTED WEARABLES

(71) Applicant: VIEYRA INC., Houston, TX (US)

(72) Inventors: Fortune Vieyra, Houston, TX (US);
Jamie Ibanez, Houston, TX (US)

(73) Assignee: VIEYRA INC., Houston, TX (US)

( * ) Notice: Subject to any disclaimer, the term of this patent is extended or adjusted under 35 U.S.C. 154(b) by 0 days.

(21) Appl. No.: 15/881,326

(22) Filed: Jan. 26, 2018

(51) Int. Cl.
| | | |
|---|---|---|
| *H05K 9/00* | (2006.01) | |
| *A45C 3/00* | (2006.01) | |
| *A45C 1/06* | (2006.01) | |
| *A45C 1/02* | (2006.01) | |
| *A45C 3/06* | (2006.01) | |
| *A45C 5/03* | (2006.01) | |
| *A45C 5/02* | (2006.01) | |
| *A45F 3/04* | (2006.01) | |
| *A45C 11/00* | (2006.01) | |
| *A45C 13/18* | (2006.01) | |
| *A41D 27/20* | (2006.01) | |
| *A41D 19/00* | (2006.01) | |
| *A45C 13/10* | (2006.01) | |
| *A43B 23/02* | (2006.01) | |
| *A41F 9/02* | (2006.01) | |
| *A41B 11/00* | (2006.01) | |

(52) U.S. Cl.
CPC ......... *H05K 9/0007* (2013.01); *A41D 19/002* (2013.01); *A41D 27/205* (2013.01); *A45C 1/02* (2013.01); *A45C 1/06* (2013.01); *A45C 3/001* (2013.01); *A45C 3/06* (2013.01); *A45C 5/02* (2013.01); *A45C 5/03* (2013.01); *A45C 11/00* (2013.01); *A45C 13/103* (2013.01); *A45C 13/185* (2013.01); *A45F 3/04* (2013.01); *H05K 9/0043* (2013.01); *A41B 11/006* (2013.01); *A41D 2300/322* (2013.01); *A41D 2400/00* (2013.01); *A41F 9/025* (2013.01); *A43B 23/0245* (2013.01); *A45C 2001/026* (2013.01); *A45C 2011/002* (2013.01); *A45C 2011/003* (2013.01)

(58) Field of Classification Search
CPC .............................. H05K 9/00; H05K 9/0043
See application file for complete search history.

(56) References Cited

U.S. PATENT DOCUMENTS

| | | | | |
|---|---|---|---|---|
| 2006/0044206 A1* | 3/2006 | Moskowitz | ...... | G06K 19/07327 343/841 |
| 2006/0187061 A1* | 8/2006 | Colby | .................. | G06K 19/025 340/572.8 |

(Continued)

*Primary Examiner* — Hung V Ngo
(74) *Attorney, Agent, or Firm* — Volpe and Koenig, P.C.

(57) ABSTRACT

An apparatus and method of making the same is presented. The apparatus may comprise a front portion comprising a front exterior panel and a front interior panel, a back portion comprising a back exterior panel and a back interior panel, the back connected along two sides of the back exterior panel to two corresponding sides of the front exterior panel; and a closure part connecting the non-connected sides of the front exterior panel and the back exterior panel. The front interior panel and the back exterior panel may each comprise a slit opening for a pocket. The closure part may comprise a zipper having a key tab. The apparatus may comprise an RF blocking material. The front may further comprise a flat portion having embossed text, and may also comprise a key chain band. The apparatus may be a wallet, handbag, or other luxury accessory, and/or a wearable item.

9 Claims, 22 Drawing Sheets

(56) References Cited

U.S. PATENT DOCUMENTS

| | | | | |
|---|---|---|---|---|
| 2006/0254815 | A1* | 11/2006 | Humphrey | G06K 19/07327 174/380 |
| 2008/0058664 | A1* | 3/2008 | Mirro | A61N 1/37211 600/523 |
| 2009/0067150 | A1* | 3/2009 | Ito | A45C 11/182 361/818 |
| 2012/0168334 | A1* | 7/2012 | Wittrock | A61B 19/026 206/459.5 |
| 2012/0214545 | A1* | 8/2012 | Johnson | G08B 21/24 455/556.1 |
| 2014/0310969 | A1* | 10/2014 | Moreau | G01B 3/1041 33/769 |

\* cited by examiner

POCKETS OF VARYING SHAPES

PROTECTED WEARABLES

CROSS REFERENCE TO RELATED APPLICATION

This application incorporates by reference as if fully set forth U.S. Pat. No. 29/635,062 titled "Design for Protected Wearables" filed on the same date as the present application.

SUMMARY

A portable apparatus for securely storing personal goods, e.g., a wallet, handbag, long purse, passport holder, luggage, coin pouch, backpack, laptop bag, phone case, pocket, privacy box, smart key guard, and wearables, such as clothing, etc., and method for making the same is presented.

In today's high-tech environment, credit cards, debit cards, key fobs and other electronic devices transmit electronic signals containing personal information. Accordingly, the possibility of unauthorized collection of this information occurs. Electromagnetic (EM) shielding is the practice of surrounding electronics and cables with conductive or magnetic materials to guard against incoming or outgoing emissions of electromagnetic frequencies (EMF). This shielding practice involves surrounding electronics and cables with conductive or magnetic materials to prevent theft of electronic transmissions. Electromagnetic shielding that blocks radio frequency (RF) electromagnetic radiation is also known as RF shielding, Electromagnetic shielding that blocks magnetic frequency (MF) transmissions is also known as MF shielding.

Different materials and techniques may be used for EM shielding, such as surrounding the electronics to be protected with metallic foil or braid shield to block errant electromagnetic interference (EMI). Note that it is not necessary to have a complete, continuous enclosure so long as any openings are smaller than the electromagnetic waves that are to be blocked. Magnetic materials must be used for EM shielding in environments where the magnetic fields are slowly varied below the 100 Khz range. The use of magnetic materials draws the EMI into the magnetic field of the shielding and blocks other transmission.

Moreover, the possibility of theft of personal/credit card information can happen virtually via a process called radio frequency identification (RFID) hacking. Essentially, RFID hacking involves remotely obtaining data from the RFID information from tags on one or more credit and/or debit cards. The hacking of identifying information on these tags occurs when the identify information is retrieved by using a wireless RFID scanner penetrating tags on the credit/debit cards remotely by a hacker who walks by a victim. RFID blocking or shielding is the process of blocking RFID signals, typically using an RFID blocking sheet, from penetrating and extracting personal identifiable and sensitive information from credit/debit cards. The blocking or shielding process blocks radio signals from reaching the tag by enclosing it within a container made of material that blocks electromagnetic signals in the RFID spectrum by acting as a Faraday cage. A Faraday cage operates by taking electrostatic charges, or even certain types of electromagnetic radiation, and distributing them around the exterior of the cage, preventing data on the interior of the cage, such as data on a tag of a credit and/or debit card, from being accessed. There is a need for an apparatus, which is used for carrying credit and/or debit cards and other items, that is capable of blocking RF signals.

The present apparatus may be in the form of "accessories", such as purses, boxes, etc., and/or "sheets", such as pockets, sleeves, etc., embedded within wearable items.

In one embodiment of an accessory, the present apparatus may comprise a front portion comprising a front exterior panel and a front interior panel, a back portion comprising a back exterior panel and a back interior panel, the back portion connected along two sides of the back exterior panel to two corresponding sides of the front exterior panel; and a closure part connecting the non-connected sides of the front exterior panel and the back exterior panel. The front interior panel may comprise a slit opening for a pocket and the back interior panel may comprise another slit opening for another pocket. The closure part may comprise a zipper comprising a key tab. The front may further comprise a flat portion having embossed text. The apparatus may further comprise a key chain band. The front exterior panel and the back exterior panel may be made of leather. The apparatus may further comprise an RF (radio frequency) blocking material.

The inventive method of making an apparatus having more than one portion, each portion having a shape and size, and a closure part, may comprise for each portion of the more than one portion of the apparatus: cutting one or more outer material to the shape and size of the selected portion and placing the outer material face down on a flat surface; cutting a first soft filler to the shape and size of the selected portion and placing the first soft filler on top of the outer material, completely covering the outer material; applying adhesive around the edges of the first soft filler adhering the first soft filler to the outer material; cutting an RF blocking material to a shape and size smaller than the first soft filler; applying adhesive around the edges of the RF blocking material; cutting a second soft filler sheet to the shape and size of the RF blocking material and placing the second soft filler sheet on top of the RF blocking material; cutting an inner material to the shape and size of the outer material and placing the inner material to cover the outer material and stitching the edges of the inner material to the edges of the outer material; and stitching together all the portions of the apparatus along with the closure part. The method may further comprise stitching one portion to another portion and stitching the closure part to the stitched one portion and another portion. The method may further comprise stitching a key chain band onto the edges of the inner material.

The RF and MF blocking is not limited to accessories or hand-held wearables. There is a further need for clothing to support a basic function of blocking RF and MF signals. Thus, there is a need to design and develop clothing with durable and secure RF and MF shielding pockets.

The inventive apparatus and system provide a solution to the problem of unauthorized and/or inadvertent theft of EM, RF and MF information from personal electronics, such as credit/debit cards, cell phones, key fobs, etc., carried or possessed by a user.

BRIEF DESCRIPTION OF THE DRAWINGS

A more detailed understanding can be had from the following description, given by way of example in conjunction with the accompanying drawings wherein.

DETAILED DESCRIPTION

The inventive apparatus is a portable pouch or other device used for carrying items typically including personal identification, credit cards and/or currency. The apparatus may be carried by the user, such as a purse, wallet, handbag, etc., or worn by the user, such as a sleeve-like device that is attached to and/or embedded in an article of clothing. For instance, a wearer of jeans, shorts and/or other clothing that contain pockets may not wish to carry an apparatus to protect his or her personal items. However, if the wearer could simple place car key fob(s) and/or RF emitting debit/credit cards in pants or shirt pocket or other article of clothing, the wearer would still be protected against any RF hacking attempts.

The apparatus may be comprised of portions, such as a front portion, a rear portion and a closure part. These portions may comprise an outer material on the exterior, an inner material on the interior, and one or more portions may further contain an RF blocking technology that is layered between a soft filler material attached to the inner material, and the outer material. Embodiments of the apparatus may include a wallet, handbag, long purse, passport holder, coin pouch, laptop bag, privacy box, pocket, sleeve within an article of clothing, etc.

Figure 1:
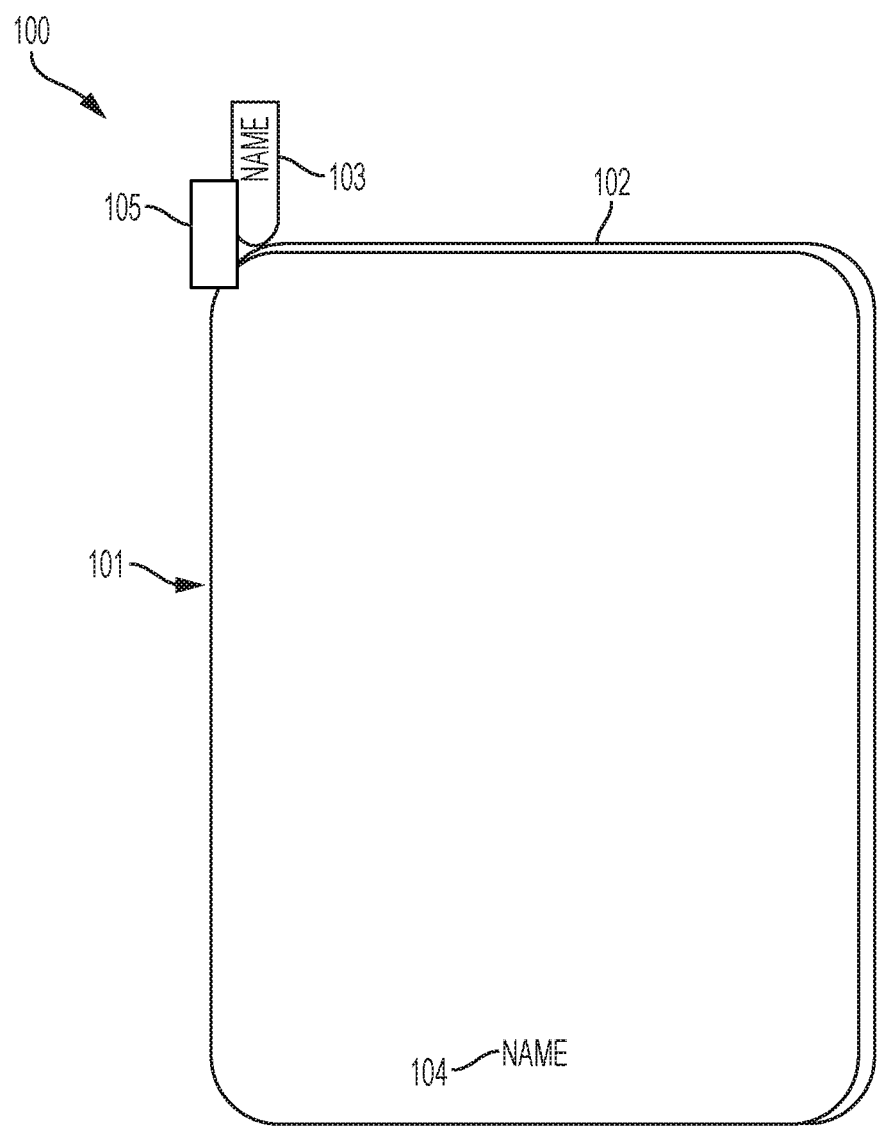
FIG. 1 is a front view of an embodiment of the present invention.

FIG. 1 is a front portion or front side 101 of a wallet 100 in an embodiment of the present invention. The front of the wallet 101 can comprise a closure part such as a zipper 102 having a zipper tab 103, a flat portion 104 for displaying a logo or other design and/or text, and a key chain band 105. The zipper 102 may be L-shaped, extending from the lower right corner of the wallet to the upper left corner. The zipper L-shaped design is advantageous because it prevents the contents within the wallet 100 from falling out when the wallet 100 is unzipped and opened. In addition, the zipper L-shaped design eliminates the requirement for an expandable guard found on other products that employ a full (U-shaped) zipper.

The zipper 102 is manipulated, e.g., opened and closed, using a zipper tab (slider & pull tab) 103 which may contain a logo or identifying element. In one embodiment, as shown in FIG. 1, the zipper tab 103 contains debossed text, e.g., the text "NAME". The zipper tab 103 is designed to be durable and fashionable. The zipper tab can contain a round semi-circle shaped ring at its foot and a flat sharp corner at its head.

The flat portion 104 may contain a metal logo. This portion 104 typically is placed on the front-center and bottom area of each product, as shown in FIG. 1. Other locations for this flat portion 104 may be used. In one embodiment, the metal logo may be embossed and slightly raised with smooth round corners. This metal logo may be smooth enough to prevent scratching and thin enough to minimize "fabric embossing" when worn on fitted clothes.

The key chain band 105 can be used to carry keys or other items. This key chain band 105 may be a retractable key chain. The key chain band 105 may be used with a key chain ring or via a hook (not shown) when the wallet 100 is clipped to some other material. In one embodiment, the key chain band 105 would be used during travel or shopping where a wearer clips the band to his belt, for example, and uses the band to protect against physical theft.

Figure 2:
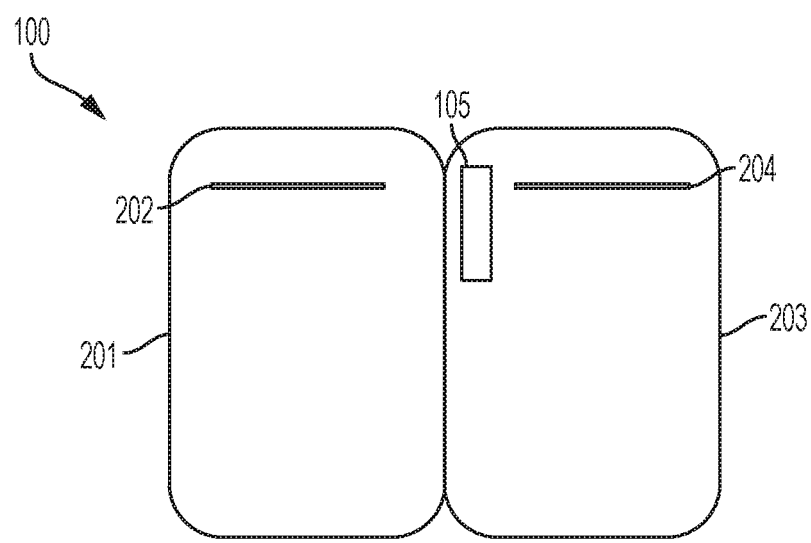
FIG. 2 is an interior view of an embodiment of the present invention.

FIG. 2 is an interior view of an embodiment of the present invention. As shown, the interior has two panels, one 201 connected to the front side 101 and the other 203 connected to the back portion or back side 301 (shown in FIG. 3) of the wallet 100. The inventive apparatus may achieve simplicity of design and ease of use in the most minimalistic fashion. To achieve simplicity, the wallet 100 may be designed with only two inner pockets 202 and 204 that are each made of durable soft leather. The inner pockets 202 and 204 can hold several debit and credit cards, store cards, gift cards, business cards, cash, keys, coins and receipts. In one embodiment, a thin insertable GPS tracker may be embedded in one of the inner pockets 202 or 204.

Also, the key chain band 105 (shown extended in FIG. 1) may be folded so that it is only in the interior, as shown in FIG. 2.

Traditionally wallets and other devices for carrying personal items can only be carried in a pocket or purse which enables pocket picking or other forms of physical theft. To protect against physical theft, the inventive apparatus is designed to support the use of wearing the apparatus on one's arm, wrist, ankle or belt.

Figure 3:
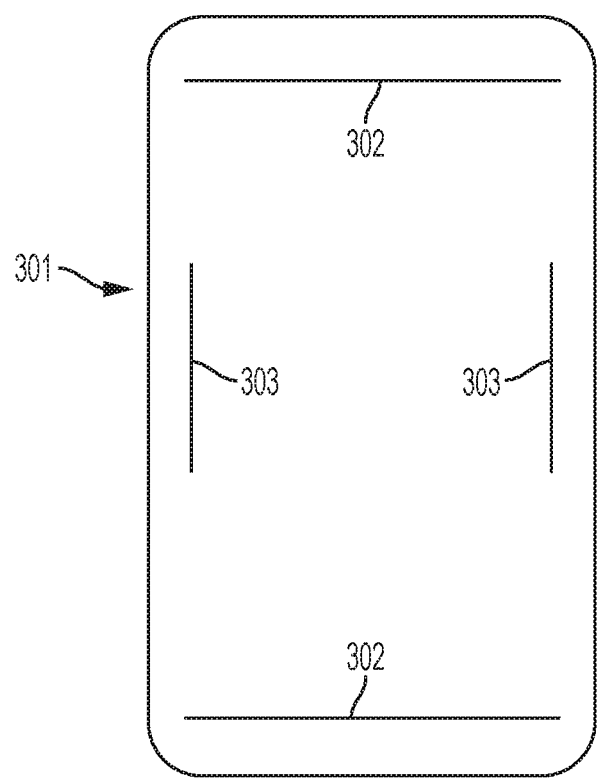
FIG. 3 is a back view of an embodiment of the present invention.

Accordingly, the inventive apparatus is designed with four slots on the back portion 301 of the wallet 100, as shown in the embodiment of FIG. 3. The back 301 contains the four slots, two horizontal 302, and two vertical 303. The two horizontal slots 302 may be along the top and bottom areas of the back 301 of the wallet. The two vertical slots 303 may be along the left and right sides of the back 301 of the wallet. The horizontal slots 302 are placed along the back 301 where a belt or other accessory 401 (see FIGS. 4 and 5) can be inserted. The vertical open slots 303 are placed on the left and right sides of the back of the wallet where an arm band or other accessory 401 can be used.

Figure 4:
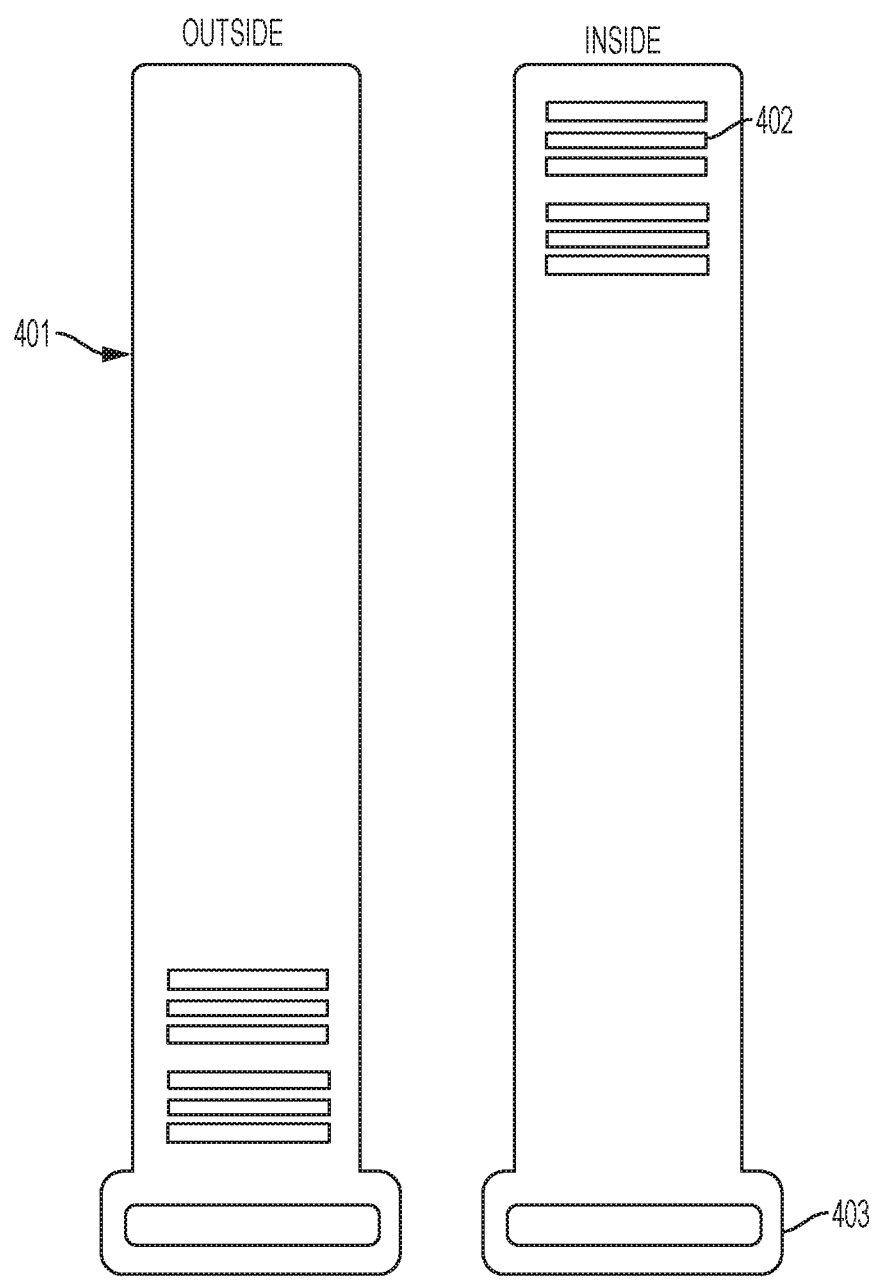
FIG. 4 is a view of an accessory for use with in an embodiment of the present invention.

FIG. 4 is a view of an accessory 401 for use with in an embodiment of the present invention. As shown, the accessory 401, such as a belt, can have a Velcro patch 402 on one end and a loop 403 on the other end. The belt end with the Velcro 402 may be threaded through the loop 403 and fastened in place so that the wallet 100 is secured onto its carrier.

Figure 5:
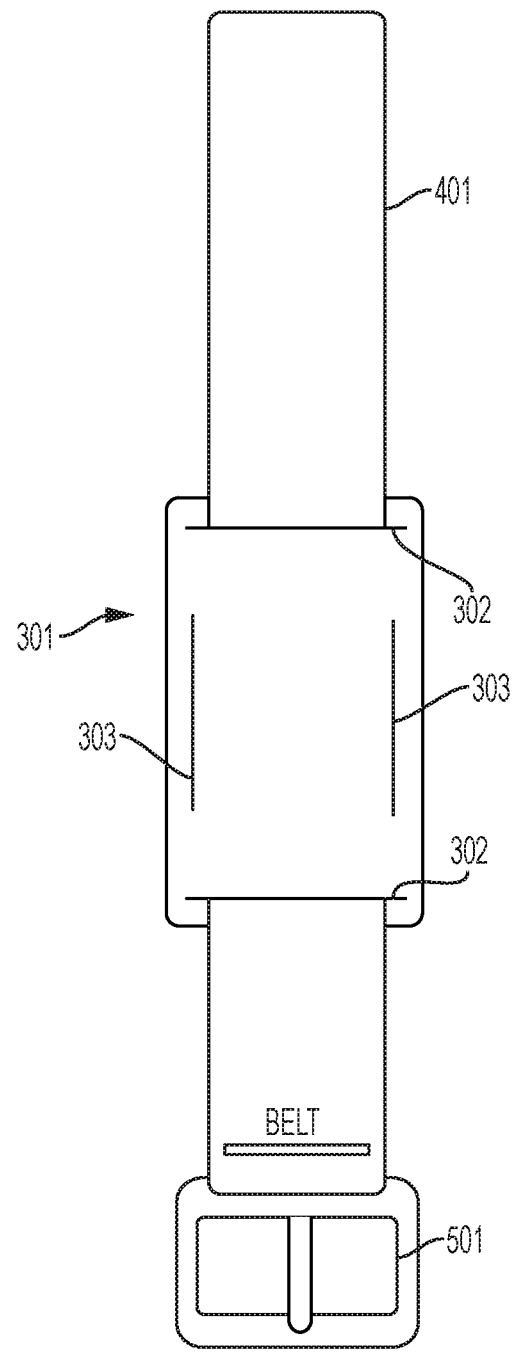
FIG. 5 is a view of an accessory in combination with an embodiment of the present invention.

FIG. 5 is a view of an accessory 401 in use with an embodiment of the present invention. FIG. 5 shows the back 301 of the wallet. A belt-type accessory 401 is attached or threaded through the horizontal slots 302 of the wallet 100. This belt-type accessory has a buckle 501 through which the opposite end of the belt 401 can be secured.

Figure 6:
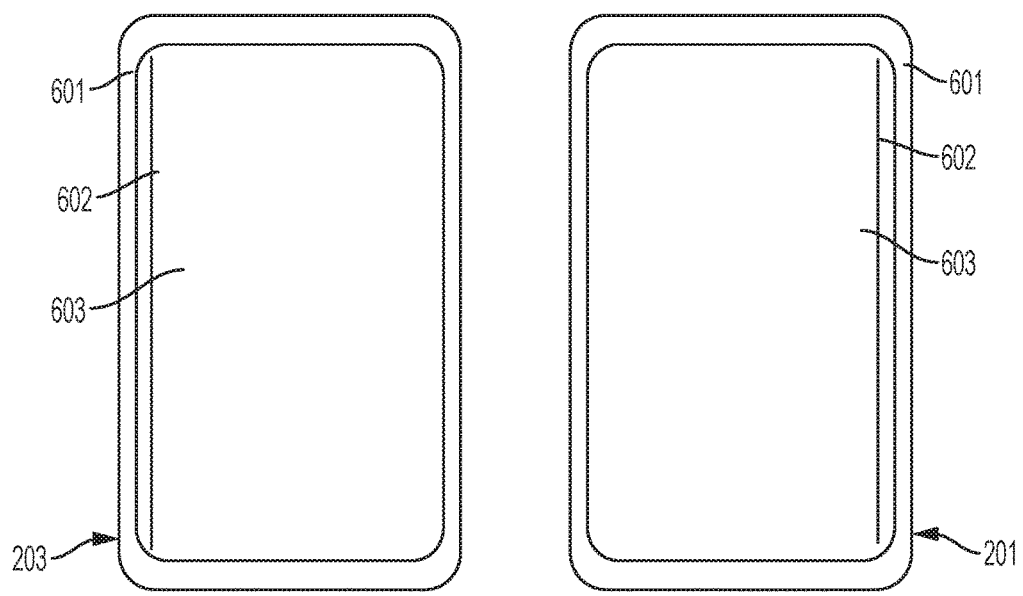
FIG. 6 is a view of the interior of an embodiment of the present invention.

FIG. 6 shows the inventive apparatus 100 with an RF blocking material such as RFID blocking sheet 602 embedded between the outer leather and inner soft leather. As shown in FIG. 6, the RFID blocking sheet 602 may be placed between two thin layers of protective sheets 601, 603.

Figure 7:
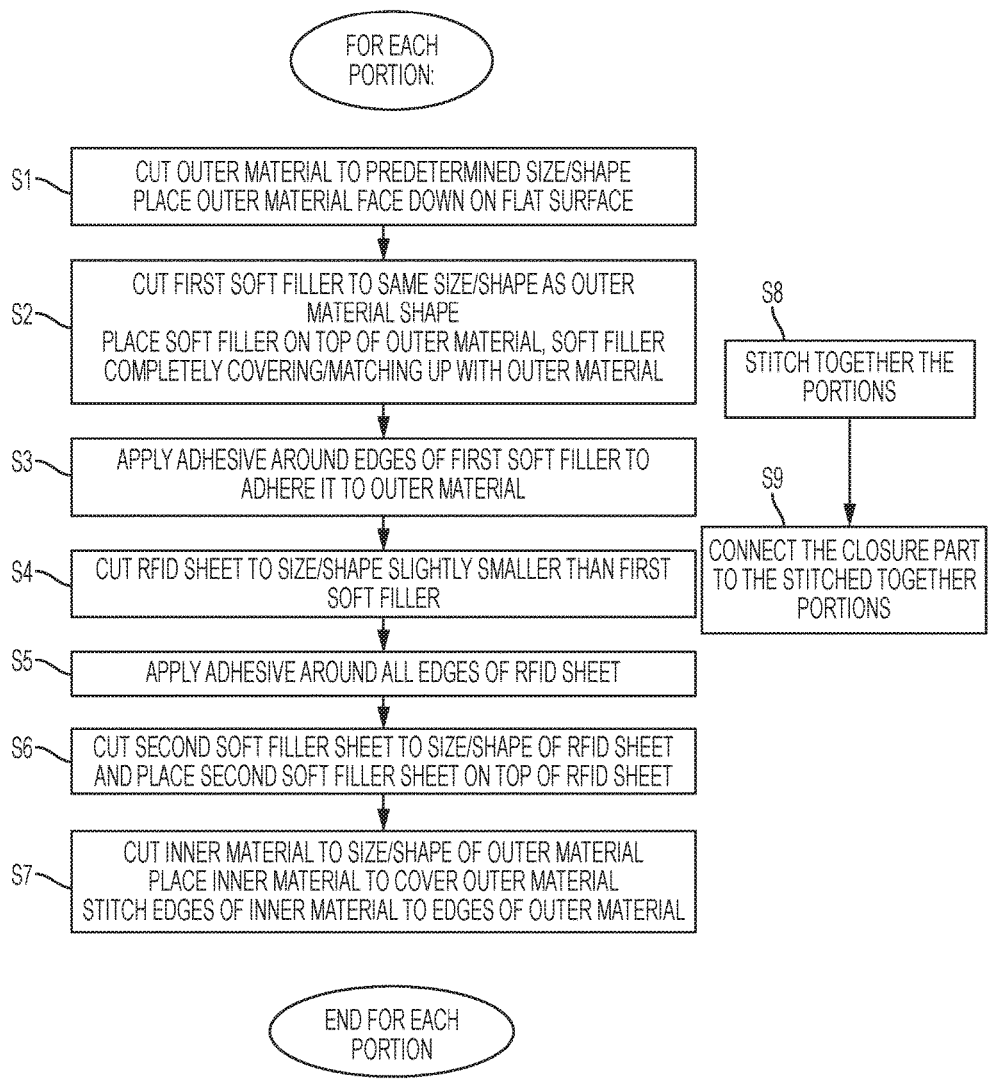
FIG. 7 is a method of making an embodiment of the present invention.

A method of making the portable apparatus is shown in FIG. 7. The apparatus comprises more than one portion, such as a front portion and a back portion, and further comprises a closure part. Each portion comprises a predetermined shape and/or size.

In step S1, cut the outer material into the predetermined shape/size of a portion, and place the outer material face down on a flat surface.

In step S2, cut a first soft filler to the same shape/size as the outer material cut in step S1. Place the soft filler on top of the outer material so that the soft filler completely covers the outer material.

In step S3, apply adhesive around the edges of first soft filler to adhere it to outer material. In one embodiment, an environmentally friendly resin glue adhesive that is known to adhere to the outer material and the soft filler without causing damage can be used.

In step S4, cut an RFID sheet, from an RFID blocking material, to a size/shape slightly smaller than the first soft filler.

In step S5, apply adhesive around the edges of the RFID sheet. In one embodiment, the same adhesive that is used in step S3 can be used.

In step S6, cut a second soft filler sheet to match the size/shape of the RFID sheet and place the second soft filler sheet on top of the RFID sheet.

In step S7, cut an inner material to match the size/shape of the outer material. Place the inner material to cover the outer material and stitch the edges of the inner material to the edges of the outer material. In one embodiment, a nylon material can be used as the inner material.

Repeat steps S1-S7 for the remaining portions of the apparatus.

In step S8, stitch two of the edges of a portion to two edges of another portion to attach one portion to the other portion; repeat for all portions created in step S7 to create a unit having connected, e.g., stitched together portions.

In step S9, connect the closure part to the stitched together portions created in step S9. In one embodiment, the connection may be made by stitching.

In one embodiment, one of the selected portions can be a back portion. In an additional step (not shown), horizontal slots 302 and vertical slots 303 are made in the external material of this selected portion. The horizontal slots 302 can be parallel to each other and to the horizontal sides of the selected portion. Similarly, the vertical slots 303 can be parallel to each other and to the vertical sides of the selected portion. The slots 302, 303 are created and the openings created are stitched, preventing the exterior material from fraying or unraveling.

Figure 8:
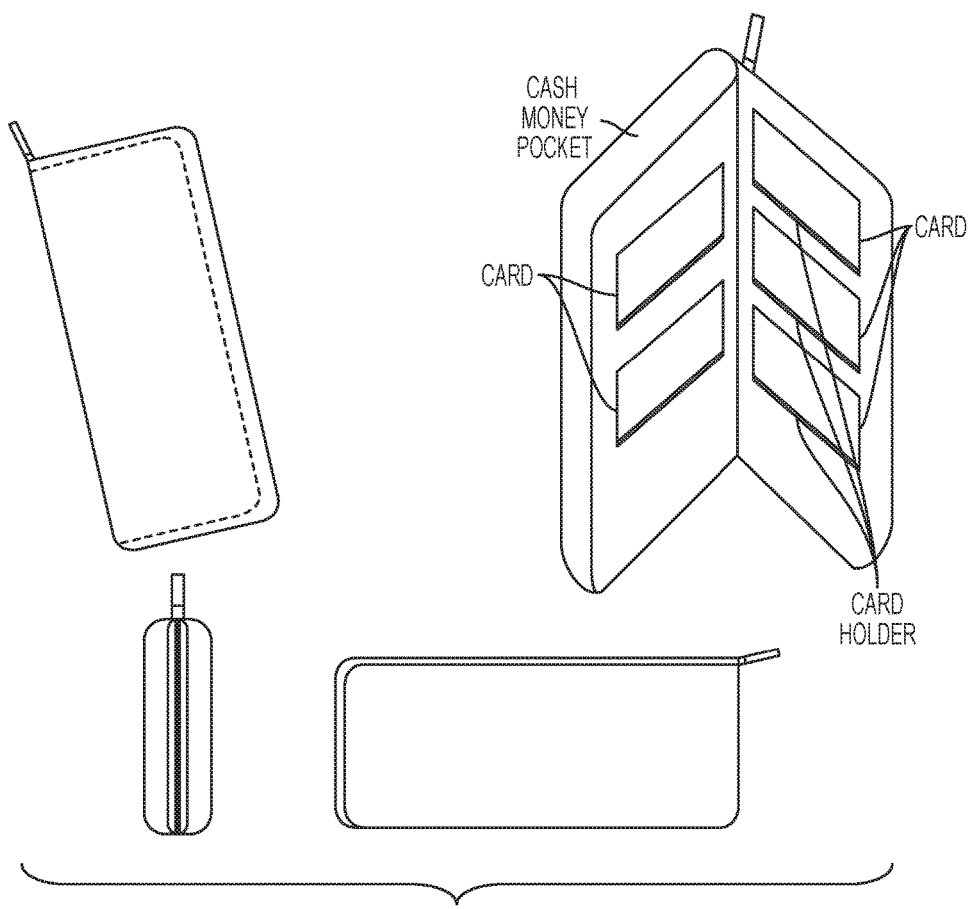
FIGS. 8-23 are some embodiments of the present invention.

In the embodiment shown in FIG. 8, the apparatus may be a long purse being twice as long as the wallet apparatus. This extra length enables the inclusion of outer pockets as well as additional open slot inner pockets. The long purse includes the RFID blocking technology found in all other embodiments, as well as the L-shaped zipper included in several embodiments. In one embodiment (not shown), the apparatus may be a passport holder being about one-and-a half times as long as the wallet apparatus and having three open slot inner pockets. The passport includes the RFID blocking technology.

Figure 9:
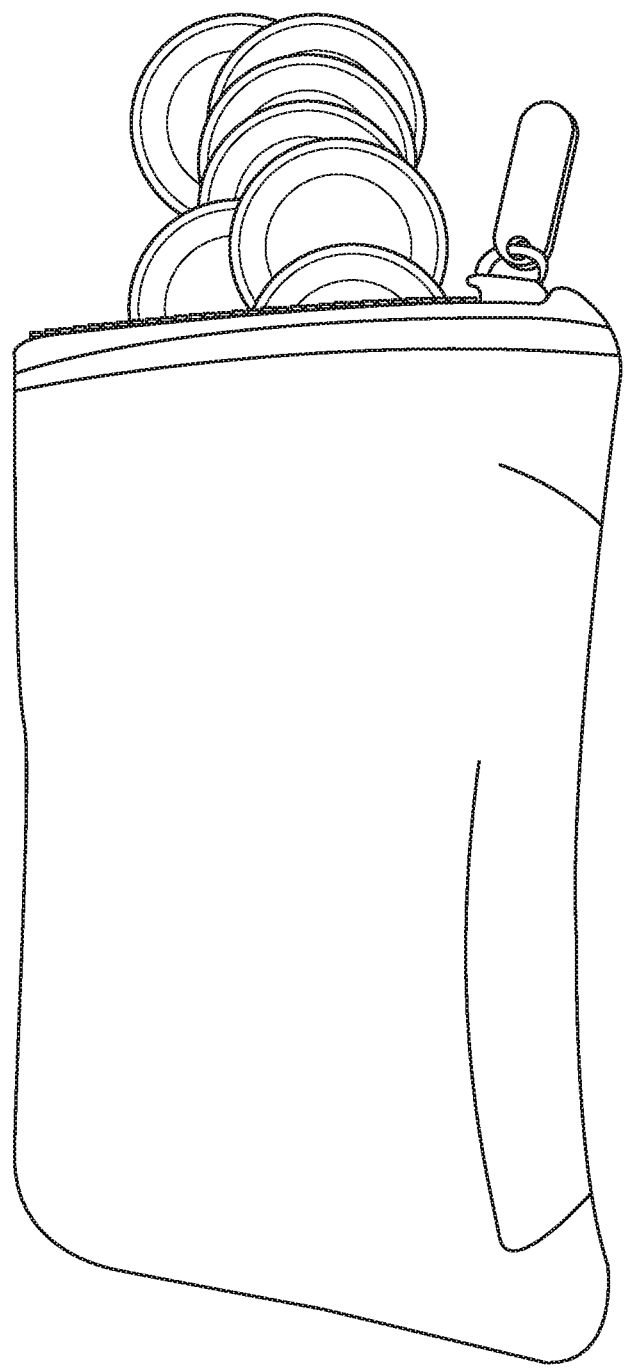

In the embodiment shown in FIG. 9, the apparatus may be a coin pouch in which the L-shaped zipper is replaced by a top horizontal zipper. The coin pouch may be the same size (height, width, depth) as the wallet apparatus.

Figure 10:
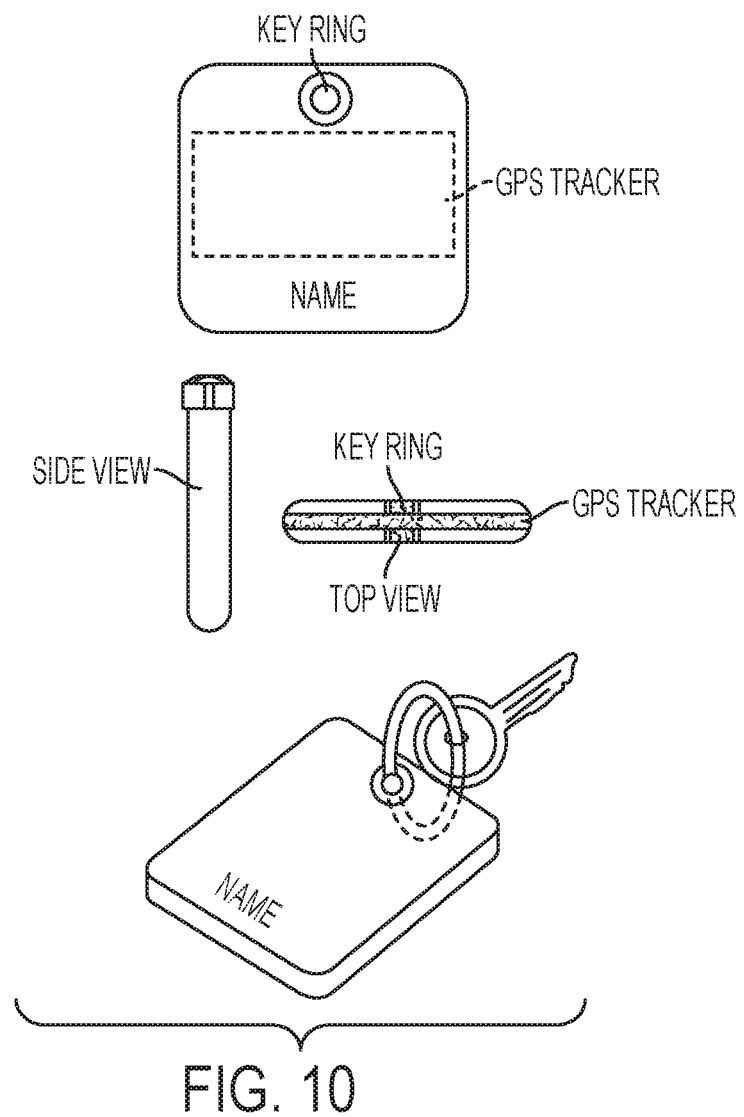

In the embodiment shown in FIG. 10, the apparatus may be a keychain or key holder that includes a GPS tracker to enable a user to locate the apparatus and keys attached to it.

Figure 11:
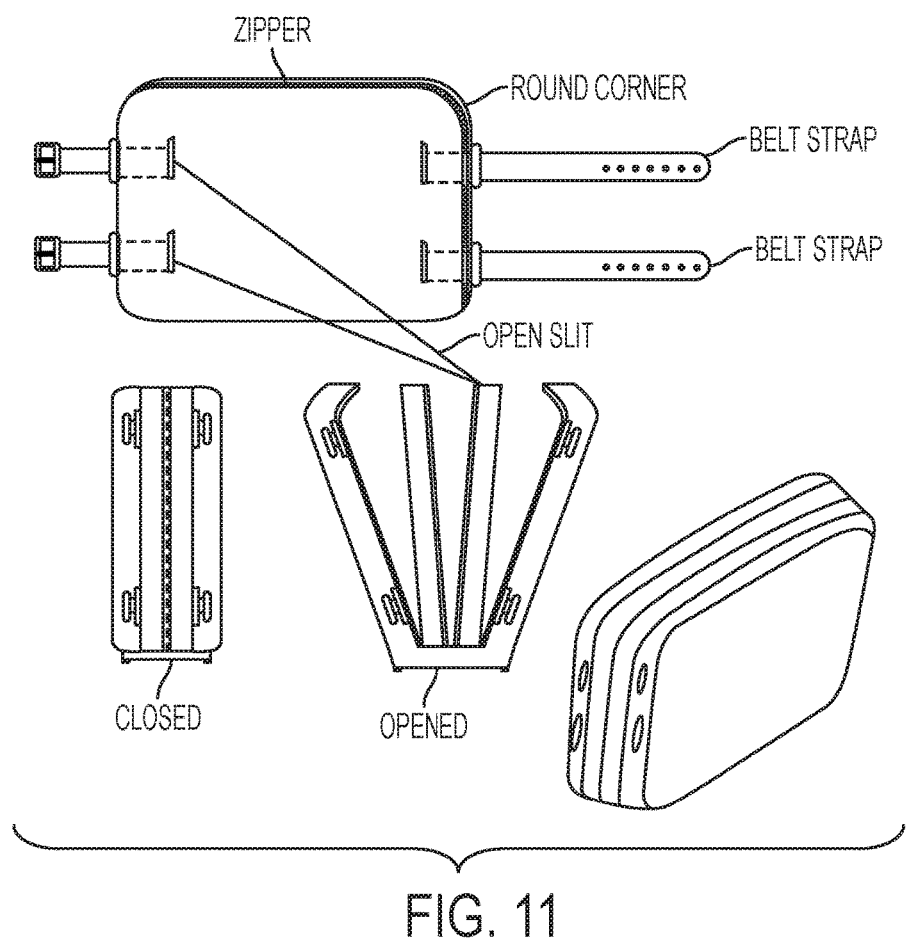

In the embodiment shown in FIG. 11, the apparatus may be a laptop bag having the L-shaped zipper and RFID blocking technology. The laptop bag may be created in sizes to hold 15 inch, 17 inch and 21 inch laptops, and may contain one inner pocket on each side of the interior.

Figure 12:
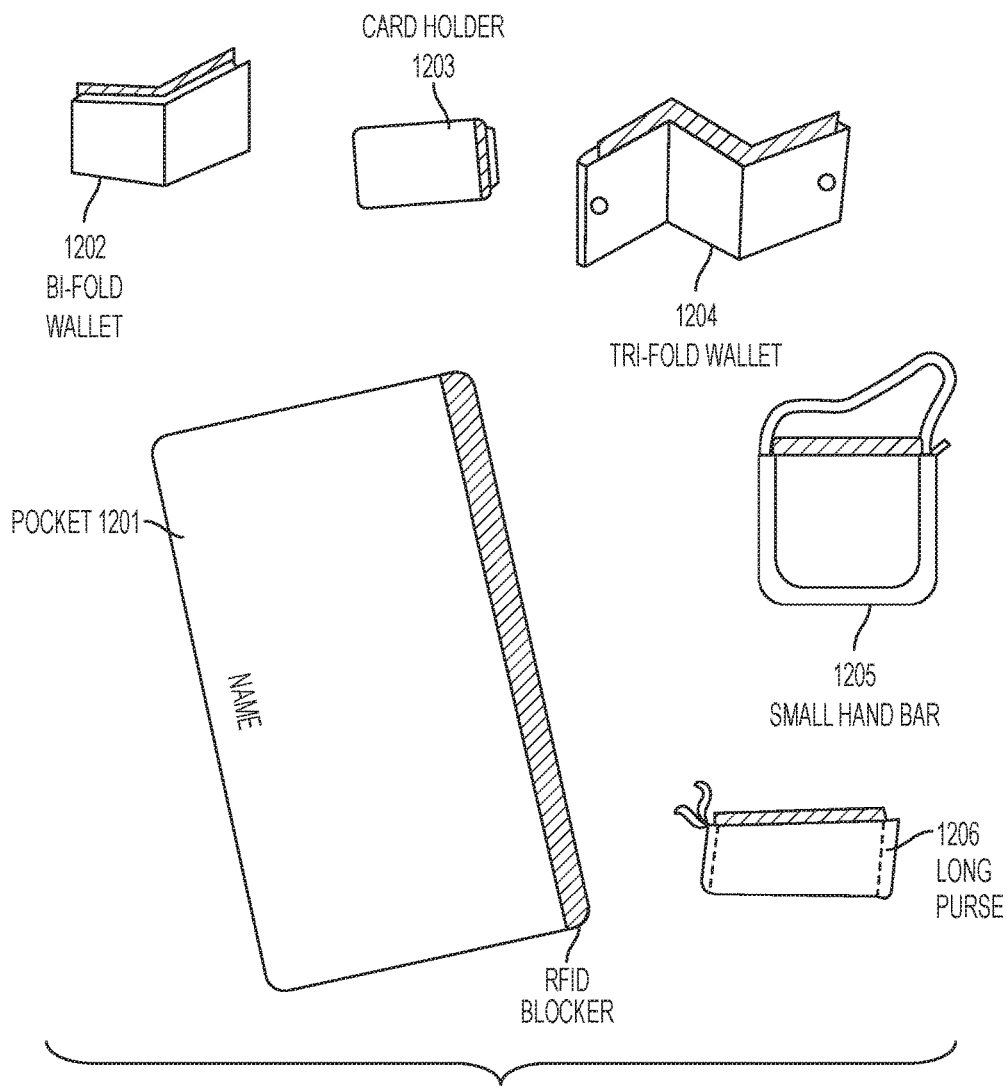

In the embodiment shown in FIG. 12, the apparatus may be a "pocket" 1201 or "sleeve" having the RFID blocking technology. As shown, the apparatus can be placed within a bi-fold wallet 1202, card holder 1203, trifold wallet 1204, small handbag 1205, and/or long purse 1206. The apparatus may have a closable opening or may be sealed closed. Alternatively, the pocket can be used separate from other devices.

Figure 13:
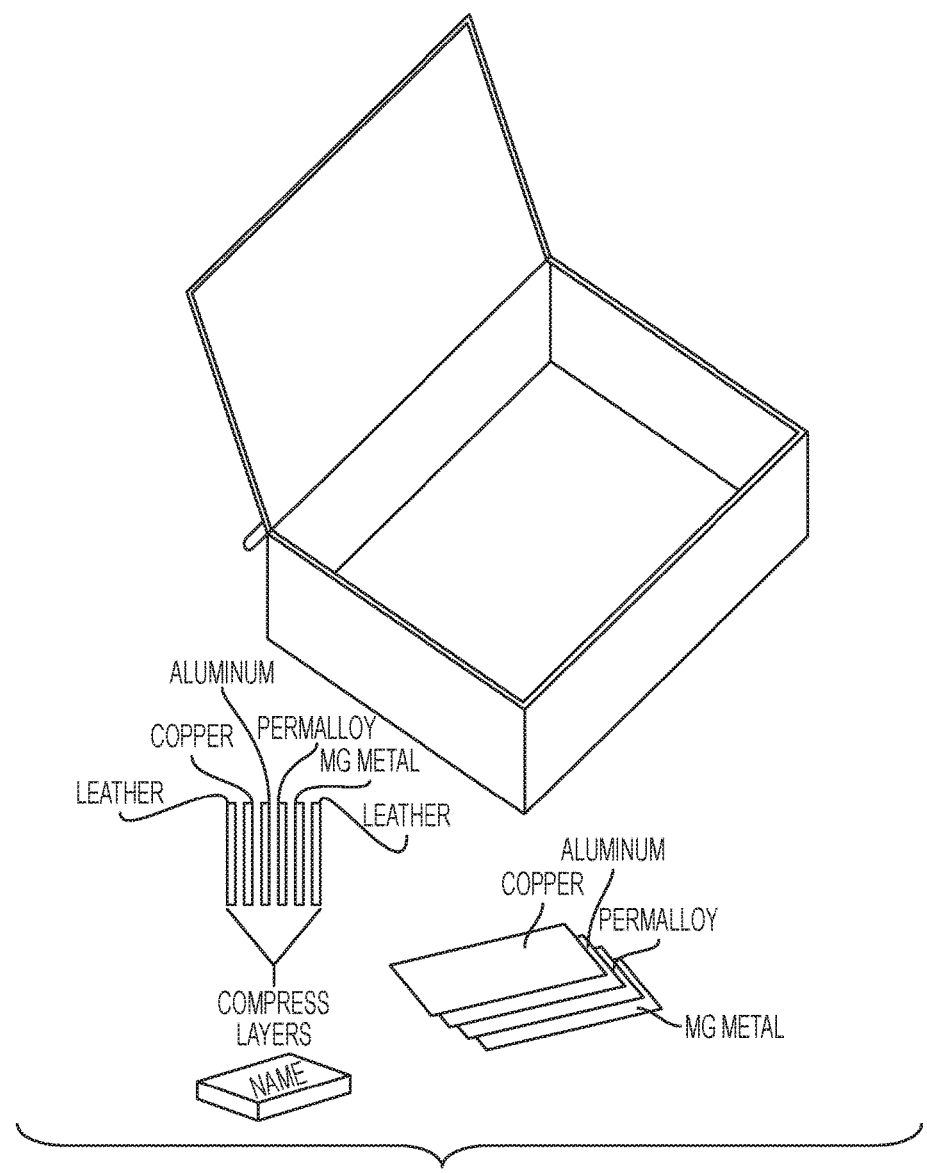

In the embodiment shown in FIG. 13, the apparatus may be a "privacy box" which comprises several layers of protective materials that protect valuables. The Privacy Box apparatus is primarily used to block key fobs, remote starters, cell phones and other remote and/or radio frequency emitting devices. RFID blocking technology as well as magnetic field blocking technology is found in the privacy box. In addition, a closure portion comprising a U-shaped zipper capable of closing the privacy box is provided. The privacy box may be a rectangular shaped box that has a single opening with a lid that can be zipped for closure. Some embodiments include a small size (5"×3.5"×2") (Length×Width×Height) in inches, Medium Size (7"×5.5"×2") and Large Size (20"×16"×4"). Some materials used in these embodiments include leather, typically used as an exterior material, copper, typically used for RF shielding, aluminum, typically used for RF shielding, permalloy, typically used to block magnetic fields, Mu-metal, typically used to block magnetic fields, and soft filler, typically used as a padding between the exterior material and the shielding/blocking materials.

The method of producing the privacy box embodiment includes repeating the steps S5 and S6, as needed, with one or more additional materials for blocking magnetic fields. In one embodiment, only copper material may be used as an additional material for blocking magnetic fields, so that steps S5 and S6 are repeated only once. In another embodiment, both copper and aluminum materials may be used, so that steps S5 and S6 are repeated twice. Various other combinations of one or more of the blocking materials of copper, aluminum, Mu-metal, permalloy and other materials, can also be used.

Figure 14A:
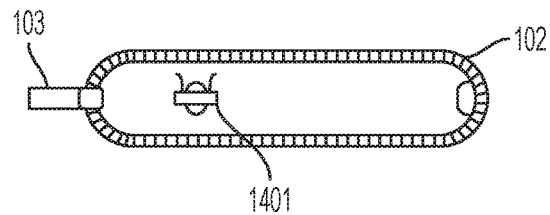
Figure 14B:
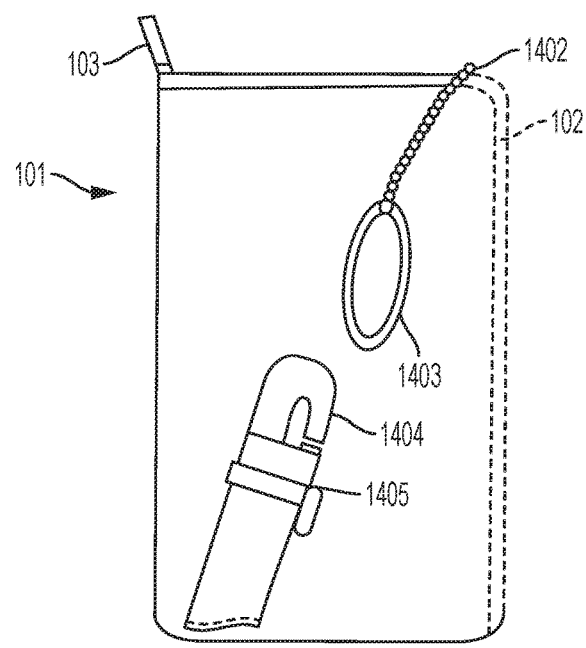
Figure 14C:
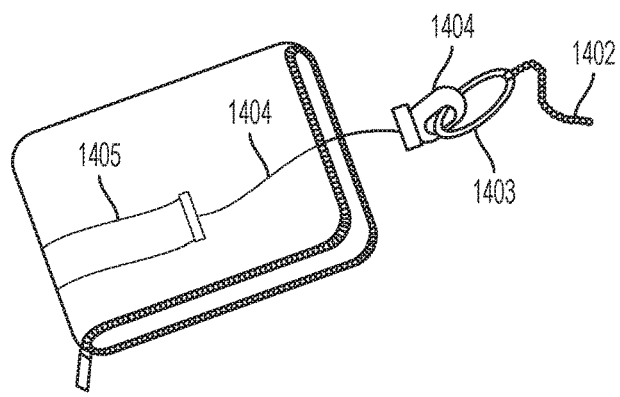

In the embodiment shown in FIGS. 14A, 14B and 14C, the apparatus may be a portable bag, e.g., "Smart Key Guard", that includes several layers of protective materials that protect valuables. This Smart Key Guard may be used to block transmission from Key Fobs, Remote Automobile Starters, and/or other remote frequency emitting devices. For example, after parking a car, the key fob may be placed in the Smart Key Guard 100, which will prevent the key fob from emitting radio signals. Thus, any attempt to redirect signals from the key fob to the car will be thwarted. The Smart Key Guard may provide additional security of an element 1402, 1403, 1404, 1405, e.g., an internal key ring lock system, that enables the keys to be retracted, released and/or locked within the apparatus 100. Accordingly, keys may be fastened or locked in place and thus not be removed or released if an accidental opening of the Smart Key Guard occurs. FIG. 14A shows the top view of the Smart Key Guard with an opening 1401 through which a key and/or key fob attached to the key ring lock system is accessed. FIG. 14B shows a view of the interior of the Smart Key Guard with the internal key ring lock system. This system may comprise a ring 1403 with a chain 1402; the user's keys and/or key fobs may be attached to the ring 1403 and accessed using the chain 1402. The ring 1403 also attaches to the connection element, e.g., clip, 1404 of the expansion element 1405. The expansion element 1405 can "expand" or extend, as well as retract, as shown in FIG. 14C. This enables the keys/key fobs attached to the ring 1403 to be pulled out, e.g. "expanded", from the interior of the Smart Key Guard. In one embodiment the expansion element 1405 may be made of nylon or other expandable material. The expansion or extension of element 1405 securely holds the user's keys and/or key fobs while enabling the user to access and employ the keys/key fobs outside the Smart Key Guard.

When the Smart Key Guard apparatus user desires to use the car key fob, for example, when the user wants to drive the car, the car key fob may be pulled out of the Smart Key Guard with the expandable element of the key ring and placed into the vehicle. When the user has completed the drive and/or no longer wants to use the car key fob, it is removed from the vehicle and retracted into the Smart Key Guard.

The Smart Key Guard may be rectangular shaped and may have an opening at the top that can be zipped when the Smart Key Guard is carried. It may contain an outer facing metal logo and may further comprise RFID blocking technology, magnetic field blocking technology and a flat zipper along its opening to provide security not only from unwanted signal transmission but also from physical loss of items placed within the Smart Key Guard. Various sizes of Smart Key Guard may include small, e.g., 5"×3.5"×2" (length×width×height), medium and large.

The method of making the Smart Key Guard may be similar to that used to make the privacy box (discussed above). For example, steps S5 and S6 may be performed multiple times to insert extra materials for blocking magnetic field into the Smart Key Guard. Various combinations of one or more of the blocking materials of copper, aluminum, Mu-metal, permalloy and other materials, can also be used.

In the embodiments shown in FIGS. 15-23, the apparatus may be considered to be "Smart Wear". RF and MF blocking is not limited to accessories or hand-held wearables. There is a further need for clothing to perform blocking RF and MF signals. For example, a wearer of jeans, shorts and/or other clothing that contains pockets may decide to not use a Smart Key Guard or Privacy Box, or may lose or misplace the inventive apparatus. If the wearer could simply place his or her car key fob or RF emitting debit/credit cards in pants or a shirt pocket, they would still be protected against any RFID hacking attempts. Thus, there is a need to design and develop clothing with RF and MF shielding pockets with stitching, and with the L-shaped zipper to enhance the security of the pocket's contents.

In the embodiments shown in FIGS. 15-23, pockets of the Smart Wear may be enclosed with any RF and/or MF blocking material, where the enclosing material could be a waterproof, synthetic nylon material that can be washed and dried without loss of its protective properties.

Figure 15:
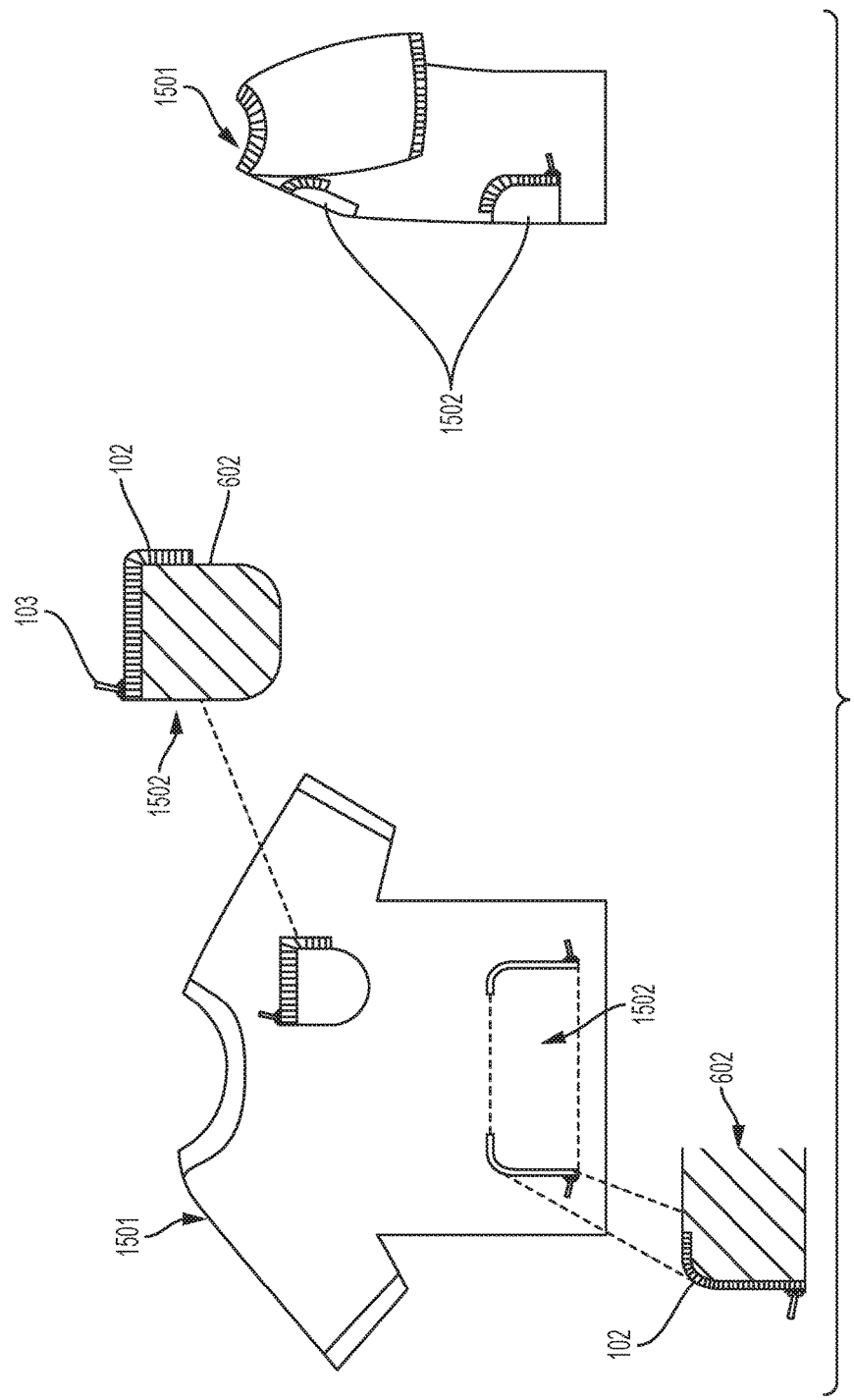
Figure 16:
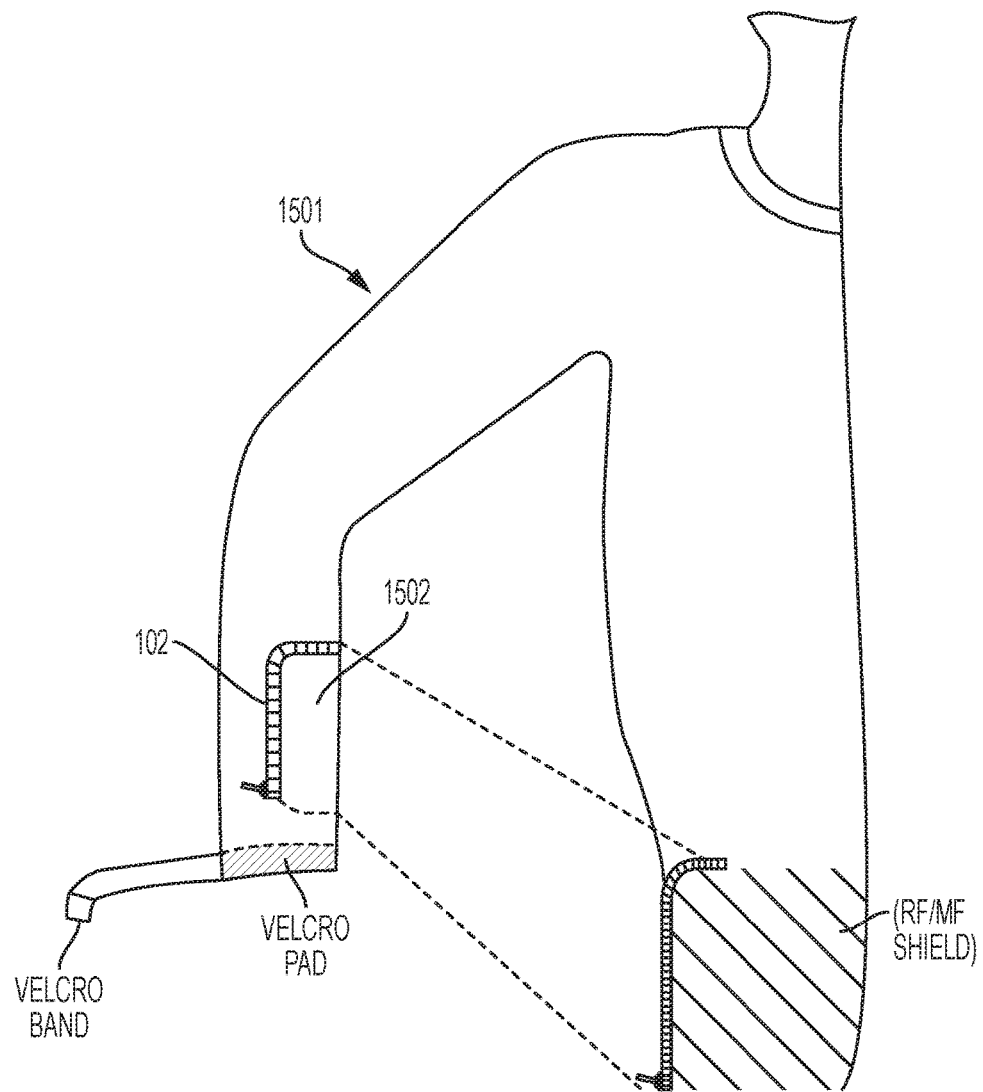

FIGS. 15 and 16 show examples of clothing "tops" 1501, such as shirts, sweaters, jackets, vests, etc., where the pocket may be placed. Each article of clothing may contain one or more pockets 1502. In the top 1501 shown in FIG. 15, a "pocket" 1502 can comprise a zipper 102 having a zipper tag 103, and the RF and/or MF blocking material 602 embedded between two protective layers 1503 of fabric. The fabric may be a waterproof, synthetic nylon material as described above. The zipper 102 typically is L-shaped enabling valuables to be securely enclosed. FIG. 16 shows another example of clothing "tops" 1501 where the pocket may be placed on the sleeve of the clothing.

Figure 17:
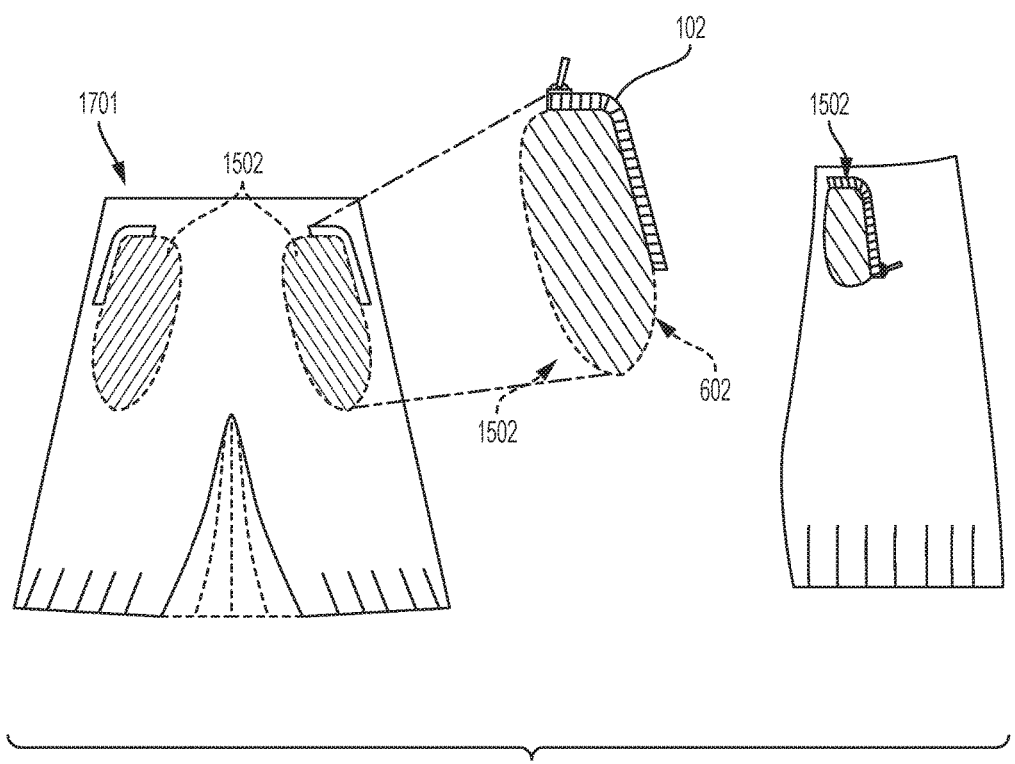
Figure 18:
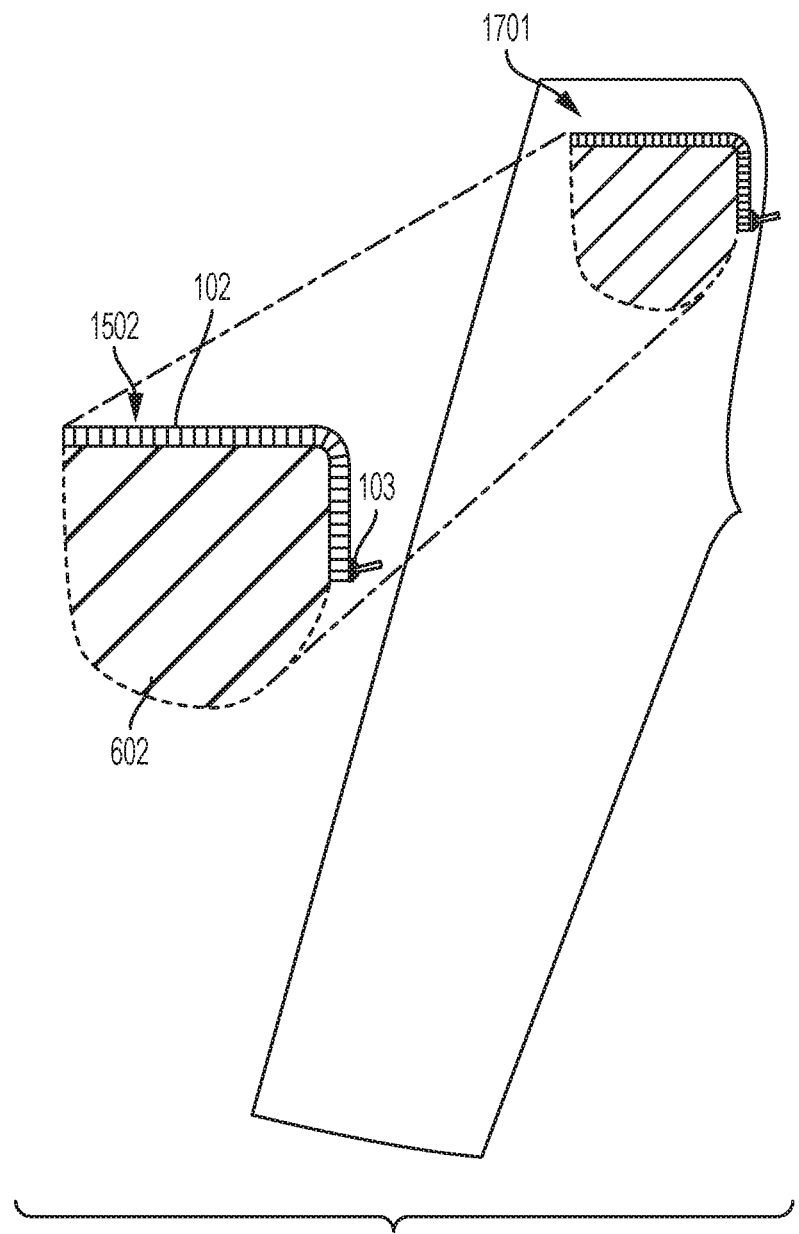

FIGS. 17 and 18 show examples of "bottoms" 1701 such as pants, shorts, skirts, etc. These bottoms 1601 may contain one or more pockets 1502, each having an L-shaped zipper 102, and blocking material 602. FIG. 17 shows a front view of an example of the bottoms 1701 and FIG. 18 shows a rear view of an example of the bottoms 1701.

Figure 19:
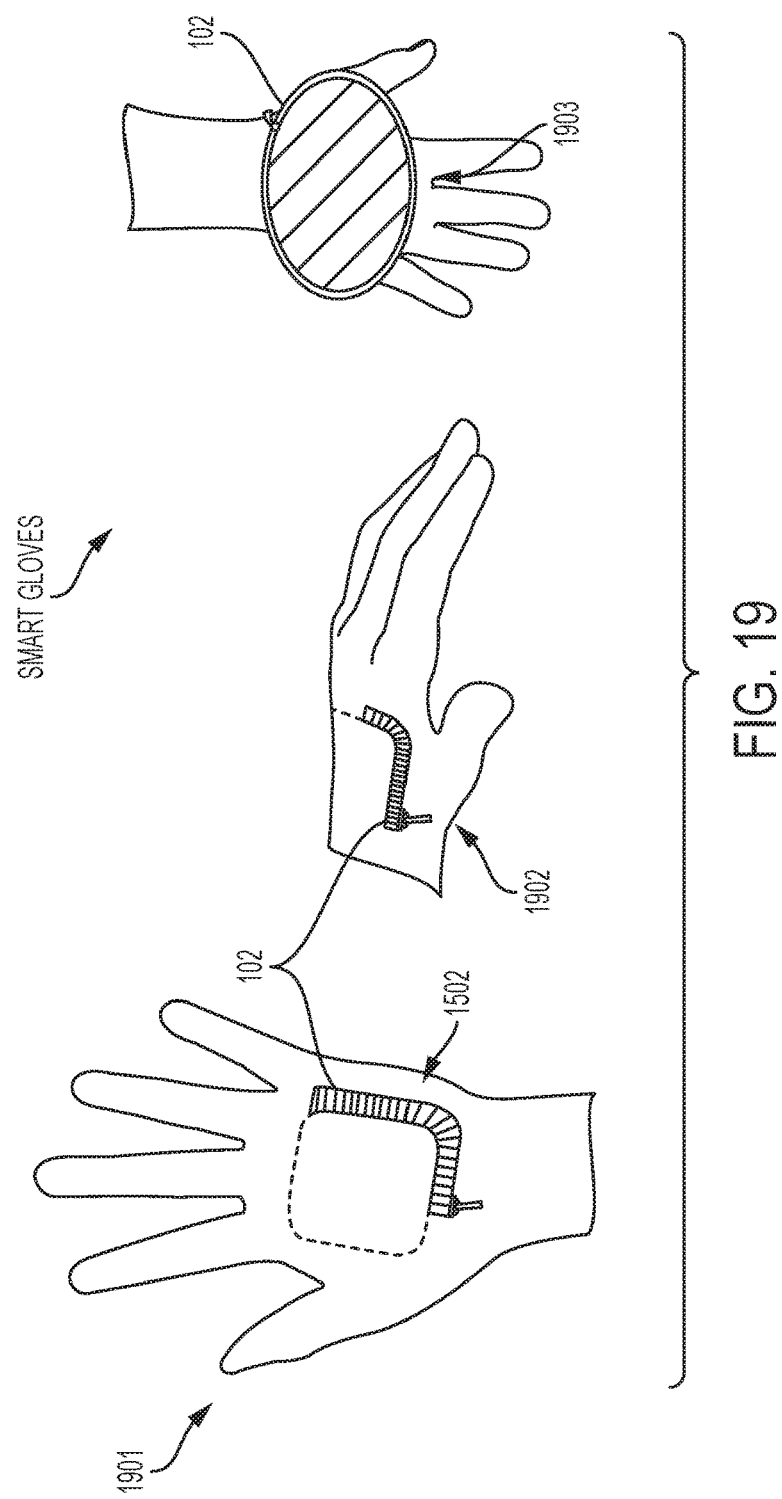

In some types of clothing, for example, formal dress clothing or sports clothing, there may not be any pockets provided. In these situations, the wearer can make use of the present shoes, gloves and/or socks that perform the same function of protecting valuables. Examples would be when a person is participating in sporting activities, such as running or cycling, and doesn't have pockets to store valuables. In this situation, wearing socks, gloves and/or shoes that contain RF/MF blocking pockets would be very useful. FIG. 19 shows examples of gloves 1901, 1902, 1903 having the inventive pockets 1502 with L-shaped zippers 102 in accordance with the present invention. Example gloves are shown from various angles, such as a front view 1901, a side view 1902 and a top view 1903, to illustrate a variety of locations of the pocket 1501 in different gloves.

Figure 20:
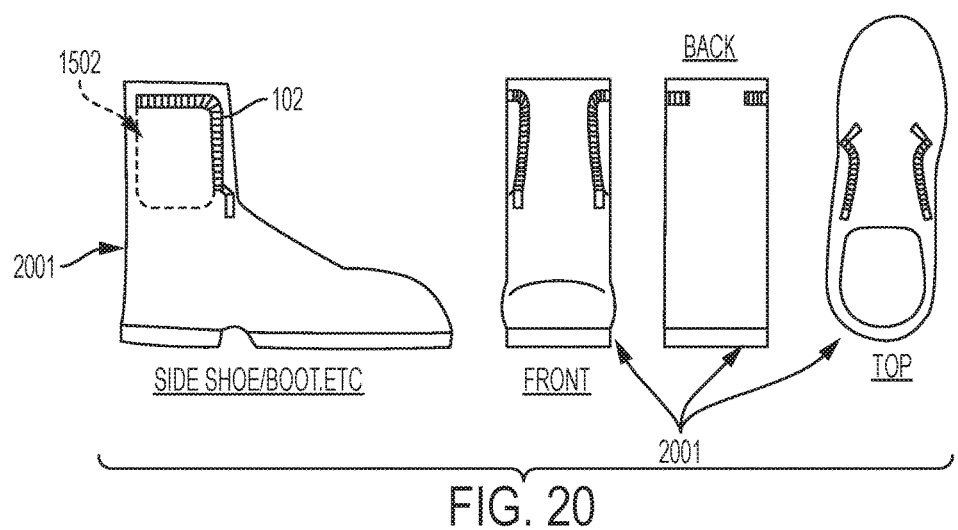
Figure 21:
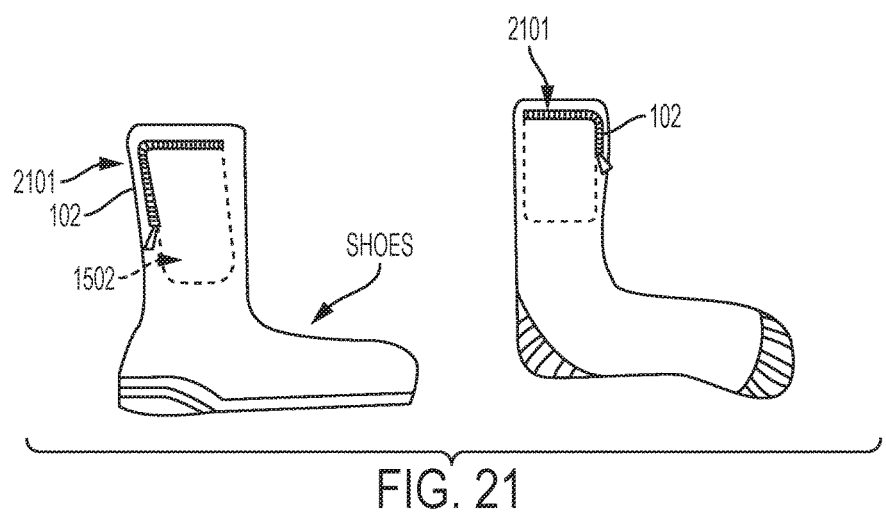

FIG. 20 shows examples of shoes 2001 having the inventive pockets 1501 with L-shaped zippers 102 and zipper tags 103. FIG. 20 shows examples of a front view, a side view, a rear view and a top view of a shoe having the inventive pockets 1501. FIG. 21 shows examples of socks 2101, also in accordance with the present invention, having L-shaped zippers 102 and zipper tags 103.

Figure 22:
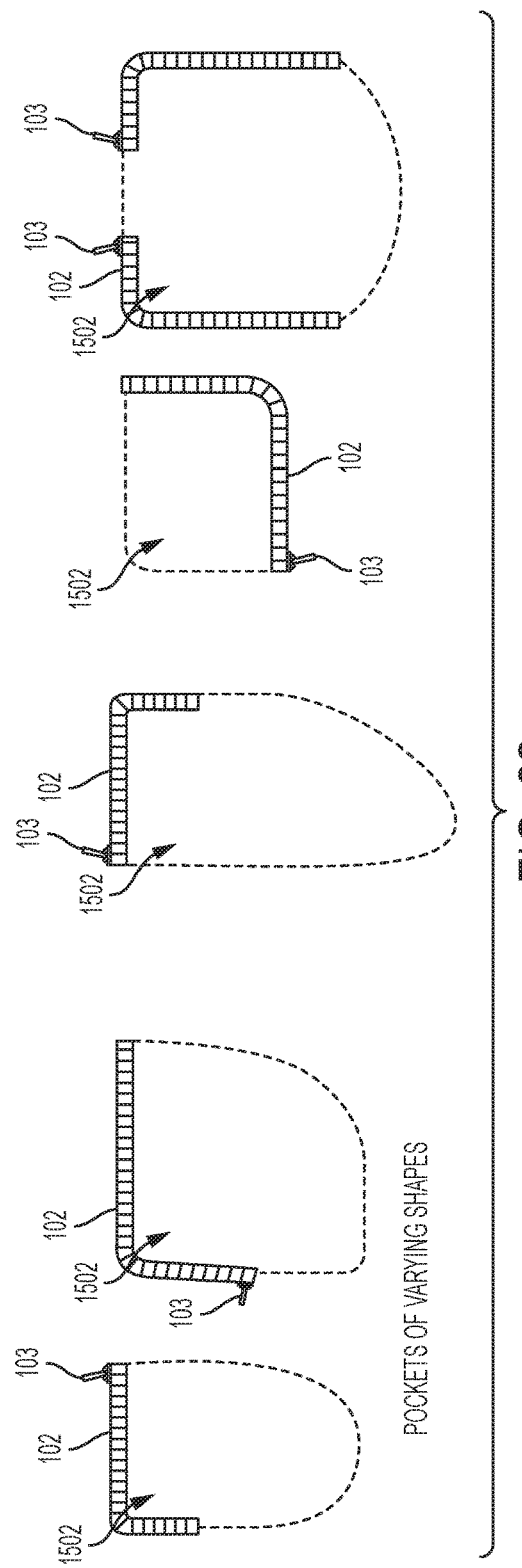

FIG. 22 illustrates the various sizes and shapes of the inventive pockets. In these embodiments, each pocket has one L-shaped zipper 102. In other embodiments, the pockets may have two L-shaped zippers at opposite ends.

Figure 23:
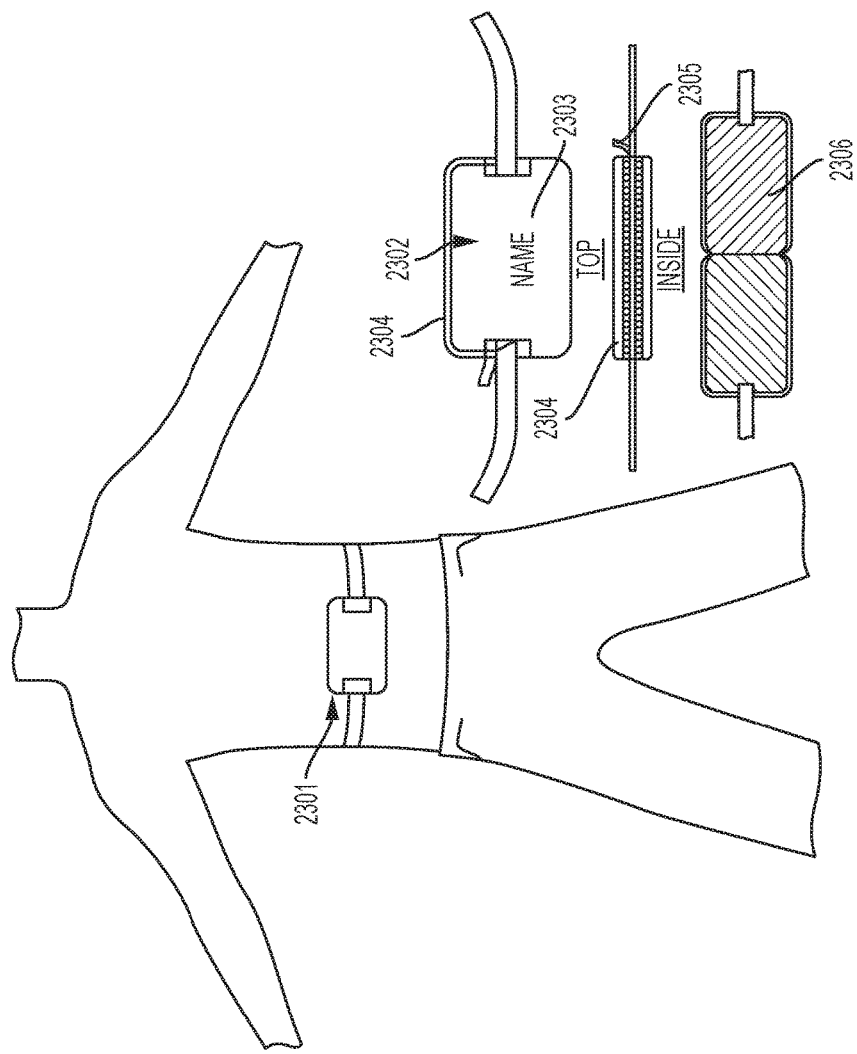

FIG. 23 shows an embodiment of the invention in accordance with a money belt. In this embodiment, the inventive pocket apparatus 2301 may be within a pouch that can be worn on a user's body. The inventive apparatus 2301 may comprise a front portion 2302, which can comprise a flat portion 2303 capable of displaying a logo and/or other design and/or text. The apparatus 2301 can further comprise a closure part such as a zipper 2304 having a zipper tab 2305. The apparatus can further comprise RF and/or MF blocking material 2306.

In addition to the use of RF/MF blocking materials, a unique feature of the inventive pocket within each article of clothing may be an "L-Shaped" zipper enclosing valuables. In one embodiment, the pocket may have two L-shaped zippers, as shown, for example, in FIG. 15.

The apparatus soft filler material may be a soft, thin sheet of fabric that protects the RF blocking material from possible damages. This soft filler is typically not visible to the device user. In one embodiment, two soft filler sheets are used, one on either side of each RF blocking material. Soft filler materials may be cotton, polyester, nylon and/or other appropriate fabrics.

The apparatus outer material may be on its exterior portions, e.g., front, back, and sides (if any), forming a covering for the apparatus; this outerwear material may include varying grades of leather and exotic skins. The material may have two sides, outer material and inner material. Exemplary materials include, but are not limited to, Saffiano leather, cow/calf skin leather, lizard, python, ostrich, alligator and other such material. The leather may be etched with a unique pattern that defines quality and represents luxury and durability. In one embodiment, the use of Saffiano leather helps maintain the longevity of the products over time.

The apparatus inner material may be on the interior portions of the apparatus. For example, a nylon synthetic thermoplastic polymer may be used as the interior padding; such material is a durable fabric and fiber for apparel.

The present apparatus provides its users with maximum security and longevity by employing durable, secure materials into a unique design. For example, in one embodiment, Saffiano Leather and/or other exotic materials are used instead of traditional cowhide; these premium materials provide more durability increasing the longevity of the apparatus. Further, the RF blocking material may be cut to a size and shape to ensure a perfect fit cut for maximum RF Blocking.

Noteworthy features of the apparatus may include its signature (L-Shaped) corner closure part that provides strong enclosing that limits the chance of valuables falling out, and its open slits that provide a way for the wallet to be attached to a belt or arm band. No other company has this unique (L-Shaped) design feature. Further, the RF blocking material within the inner material creates "pockets" or bags of various sizes. Other items in the market place with RF blocking exist only as sleeves that have only one design style and use only one RF blocking material. Using one or more RF and MF blocking materials in varying orders or combinations for use in protecting valuables is another unique feature of the apparatus.

It should be understood that many variations are possible based on the disclosure herein. Although features and elements are described above in particular combinations, each feature or element can be used alone without the other features and elements or in various combinations with or without other features and elements.

What is claimed is:

1. An apparatus comprising:
    a front portion comprising a front exterior panel, a front interior panel and a first RF blocking sheet located between the front exterior panel and the front interior panel;
    a first inner pocket located between the front interior panel and a second RF blocking sheet, wherein the first RF blocking sheet and the second RF blocking sheet stop electromagnetic radiation from being transmitted from the first inner pocket;
    a back portion comprising a back exterior panel and a back interior panel, the back portion connected along connected sides of the back exterior panel to corresponding sides of the front exterior panel;
    a second inner pocket formed between the back interior panel, and the back exterior panel wherein the second inner pocket stores a non-protected device; and
    a closure part connecting non-connected sides of the front exterior panel and the back exterior panel.

2. The apparatus of claim 1, the back exterior panel comprising two parallel horizontal slots and two parallel vertical slots.

3. The apparatus of claim 2, wherein each slot has reinforcement stitching.

4. The apparatus of claim 1, the closure part comprising a zipper comprising a key tab.

5. The apparatus of claim 1, the front further comprising a flat portion having embossed text.

6. The apparatus of claim 1, further comprising a key chain band.

7. The apparatus of claim 1, wherein the front exterior panel and the back exterior panel are leather.

8. The apparatus of claim 1, wherein the non-protected device is a GPS tracker.

9. The apparatus of claim 1, wherein the apparatus is one of a wallet, a handbag, a long purse, a passport holder, luggage, a coin pouch, a backpack, a laptop bag, a phone case, a pocket and a privacy box.

* * * * *